(12) United States Patent
Grillot et al.

(10) Patent No.: US 6,504,171 B1
(45) Date of Patent: Jan. 7, 2003

(54) CHIRPED MULTI-WELL ACTIVE REGION LED

(75) Inventors: Patrick N. Grillot, Santa Clara, CA (US); Christopher P. Kocot, Palo Alto, CA (US); Michael R. Krames, Mountain View, CA (US); Eugene I. Chen, Santa Clara, CA (US); Stephen A. Stockman, Morgan Hill, CA (US); Ying-Lan Chang, Cupertino, CA (US); Robert C. Taber, Palo Alto, CA (US)

(73) Assignee: Lumileds Lighting, U.S., LLC, San Jose, CA (US)

( * ) Notice: Subject to any disclaimer, the term of this patent is extended or adjusted under 35 U.S.C. 154(b) by 0 days.

(21) Appl. No.: 09/490,777

(22) Filed: Jan. 24, 2000

(51) Int. Cl.$^7$ .............................................. H01L 29/06
(52) U.S. Cl. ............................ 257/14; 257/13; 257/15; 257/17; 257/22; 257/86; 372/17; 372/45; 372/50; 438/22
(58) Field of Search .............................. 257/14, 13, 15, 257/17, 22, 86, 87, 190, 94; 438/22; 372/45, 46, 47, 50, 17

(56) References Cited

U.S. PATENT DOCUMENTS

| | | | |
|---|---|---|---|
| 4,318,059 A | 3/1982 | Lang et al. ..................... 372/47 |
| 4,730,331 A | 3/1988 | Burnham et al. ............... 372/50 |
| 5,057,881 A | 10/1991 | Lobentanzer et al. ......... 357/17 |
| 5,126,803 A | 6/1992 | Hager et al. ................... 357/17 |
| 5,138,624 A | 8/1992 | Hong et al. .................... 372/45 |
| 5,339,325 A * | 8/1994 | Kito et al. ...................... 372/45 |
| 5,410,159 A | 4/1995 | Sugawara et al. ............. 257/13 |
| 5,544,188 A * | 8/1996 | Takiguchi et al. ............. 372/45 |
| 5,559,820 A | 9/1996 | Kimura et al. ................. 372/46 |

(List continued on next page.)

FOREIGN PATENT DOCUMENTS

| | | | |
|---|---|---|---|
| EP | 0 661 782 | 7/1995 | ............ H01S/3/19 |
| JP | 04048786 A * | 2/1992 | |
| JP | 05 102604 | 4/1993 | ............ H01S/3/18 |

OTHER PUBLICATIONS

Mizuno, Y. et al.: "Resonant Cavity Light Emitting Diode with two SQWs of different width" Conference Proceedings. LEOS '97, 10$^{th}$ Annual Meeting. IEEE Lasers and Electro–Optics Society 1997 Annual Meeting (Cat. No. 97CH36057), pp. 9–10, vol. 2, XP002166439, 1996, New York, NY, USA, IEEE, USA, ISBN: 0–7803–3895–2.

(List continued on next page.)

Primary Examiner—Nathan J. Flynn
Assistant Examiner—Remmon R. Fordé
(74) Attorney, Agent, or Firm—Patent Law Group LLP; Rachel V. Leiterman

(57) ABSTRACT

A light emitting device and a method of increasing the light output of the device utilize a chirped multi-well active region to increase the probability of radiative recombination of electrons and holes within the light emitting active layers of the active region by altering the electron and hole distribution profiles within the light emitting active layers of the active region (i.e., across the active region). The chirped multi-well active region produces a higher and more uniform distribution of electrons and holes throughout the active region of the device by substantially offsetting carrier diffusion effects caused by differences in electron and hole mobility by using complementary differences in layer thickness and/or layer composition within the active region. Thus, the chirped design of the multi-well active region increases the probability of radiative recombination of electrons and holes within the light emitting active layers of the active region, which results in an increased light output of the device. The multi-well active region of the device may be chirped with respect to light emitting active layers and/or barrier layers of the active region. The light emitting device may be a III–V material LED, a II–VI material LED, a polymer or organic LED, a laser diode or an optical amplifier.

43 Claims, 11 Drawing Sheets

U.S. PATENT DOCUMENTS

| | | | | |
|---|---|---|---|---|
| 5,563,900 A | | 10/1996 | Ackley et al. | 372/45 |
| 5,636,236 A | * | 6/1997 | Tada et al. | 372/45 |
| 5,642,372 A | * | 6/1997 | Tomita | 372/45 |
| 5,661,742 A | | 8/1997 | Huang et al. | 372/46 |
| 5,684,309 A | | 11/1997 | McIntosh et al. | 257/191 |
| 5,959,307 A | | 9/1999 | Nakamura et al. | 257/14 |

OTHER PUBLICATIONS

Bozano et al., "Temperature– and Field–dependent electron and hole mobilities in polymer light–emitting diodes," Appl. Phys. Lett., vol. 74, No. 8, Feb. 22, 1999, pp. 1132–1134.

Gardner et al., "1.4x efficiency improvement in transparent-substrate $(Al_xGa_{1-x})_{0.5}In_{0.5}P$ light–emitting diodes with thin ($\leq 2000$ Å) active regions," Appl. Phys. Lett., vol. 74, No. 15, Apr. 12, 1999, pp. 2230–2232.

Mueller, "Electroluminescence I," *Semiconductors and Semimetals*, Academic Press, 2000, vol. 64, pp. 262–263.

Scott et al., "Hole limited recombination in polymer light-emitting diodes," Appl. Phys. Lett., vol. 74, No. 11, Mar. 15, 1999, pp. 1510–1512.

Streetman, "Appendix III, Properties of Semiconductor Materials," *Solid State Electronic Devices*, $3^{rd}$ Edition, Academic Press, 1990, p. 439.

Stringfellow et al., "High Brightness Light Emitting Diodes," *Semiconductors and Semimetals* Academic Press, 1997, vol. 48, pp. 248–251, 326–329, 434–435.

Sugawara et al., "Emission Properties of InGaAlP Visible Light–Emitting Diodes Employing a Multiquantum–Well Active Layer," Jpn. J. Appl. Phys., vol. 33, 1994, pp. 5784–5787.

* cited by examiner

CHIRPED MULTI-WELL ACTIVE REGION LED

TECHNICAL FIELD

The invention relates generally to LED structures and more particularly to the active region of an LED.

BACKGROUND ART

Light emitting diodes (LEDs) are widely accepted in many applications that require low power consumption, small dimensions, and high reliability. However, the use of LEDs in new applications is limited by their external quantum efficiency or their brightness. Therefore, many attempts have been made to improve the brightness of LEDs through various design changes. For example, improvements in LED brightness have been achieved by using multi-well active layer devices in which multiple light emitting active layers are included in the LED active region. Additional light output gains have been observed by decreasing the thickness of the individual light emitting active layers, and in the extreme case, the thickness of the individual active layers is reduced to the point where quantum confinement effects are observed (i.e., discrete or quantized energy states occur within the active layers). In such a case, the active layer thicknesses are said to have been reduced below the quantum thickness and such devices are said to operate in the quantum regime or quantum size regime. This quantum thickness depends on certain material parameters such as the electron or hole effective mass, and is therefore different for different materials. For AlGaInP LEDs, the quantum thickness is about 100 Angstroms, while for AlGaInN LEDs, the quantum thickness is about 60 Angstroms. In the context of this disclosure, we define the aforementioned LEDs as multi-well (MW) LEDs, regardless of individual active layer thickness, i.e., regardless of whether the individual active layers are thinner than the quantum thickness or thicker than the quantum thickness. Examples of such MW active layer LEDs and laser diodes are provided in U.S. Pat. No. 4,318,059 to Lang et al., U.S. Pat. No. 5,410,159 to Sugawara et al. and U.S. Pat. No. 5,661,742 to Huang et al.

In contrast to the MW LEDs discussed above, LEDs having a single active layer will be referred to either as double heterostructure (DH) LEDs, or as single quantum well (SQW) LEDs, depending on whether the individual active layer thickness values are greater than or less than the quantum thickness, respectively.

A conventional MW LED is schematically illustrated in FIG. 1. The LED 10 includes a substrate 12 of first conductivity type, a lower confining layer 14 of first conductivity type, the active region 16 which may be of first conductivity type, may be undoped, or may be of second conductivity type, an upper confining layer 18 of second conductivity type, and an optional window layer 20 of second conductivity type. The active region includes two or more thin active layers 22 that are separated from each other by one or more barrier layers 24. Although the active region is shown to include four active layers, the number of active layers can be anywhere from two to forty or more. In the most common configuration, the lower confining layer is made of an n-type semiconductor material, while the upper confining layer is made of a p-type semiconductor material. In this case, the n-type lower confining layer is electrically connected to an n-type ohmic contact 26 via the substrate 12, and the p-type upper confining layer 18 or optional p-type window layer 20 is electrically connected to a p-type ohmic contact 28. (It is also possible to grow or bond or otherwise attach the LED to a p-type substrate or other material such as metal, glass, etc., such that the lower confining layer is p-type and the upper confining layer and optional window layer are n-type. Since the most common LED configuration includes an n-type substrate, we use this case as an example here. Hence, in these examples, the first conductivity type is n-type, and the second conductivity type is p-type.)

When a potential is applied to the ohmic contacts 26 and 28, electrons are injected into the active region 16 from the n-type lower confining layer 14 and holes are injected into the active region from the p-type upper confining layer 18. The radiative recombination of electrons and holes within the active layers 22 generates light. However, if the recombination occurs within a layer other than one of the active layers, such as the lower confining layer, the upper confining layer, or a barrier layer within the active region, no light is generated. Thus, it is desirable to increase the probability that the electrons and holes recombine within the active layers, as opposed to recombining within some other layer of the device. The multiple wells formed by the active layers 22 of the LED 10 increase the radiative recombination probability by allowing holes or electrons that did not recombine in one of the active layers a chance to recombine in another active layer. The increase in radiative recombination of electrons and holes within the active layers of the LED equates to an increase in the light output of the LED.

Although light output gains can be realized by implementing a multi-well structure, additional light output gains are desired to achieve more widespread use of LEDs. A concern with conventional LED designs is that light is not emitted equally from all wells, and in some extreme cases, especially for AlGaInN devices (as will be illustrated in FIG. 7), most of the light is emitted only from one or two wells in the structure. Thus, some of the wells in a conventional LED do not contribute effectively to the brightness of the LED. This problem is compounded in a transparent substrate LED in that some fraction of the light that is generated within one active layer may be absorbed in another active layer of the active region. Thus, an active layer that does not contribute efficiently to light generation limits the light output of the device in two ways. First of course, it does not generate light efficiently. Second, it may absorb some fraction of the light generated by other active layers within the active region.

In light of the above concern, what is needed is a method for increasing the light output or light generation efficiency of each well in a multi-well LED.

SUMMARY OF THE INVENTION

A light emitting device and a method of improving the light output of the device utilize a chirped multi-well active region to increase the probability of radiative recombination of electrons and holes within the light emitting active layers of the active region by altering the distribution of electrons and holes within the light emitting active layers of the active region (i.e., across the active region).

In an exemplary embodiment, the LED is an AlGaInP LED that includes a substrate of first conductivity type, an optional distributed Bragg reflector layer of first conductivity type, a lower confining layer of first conductivity type, an optional lower set-back layer of first conductivity type, the chirped multi-well active region which may be of first conductivity type, may be undoped, or may be of second conductivity type, an optional upper set-back layer of second conductivity type, an upper confining layer of second conductivity type, and an optional window layer of second conductivity type. The substrate is made of a semiconductor material, such as GaAs or GaP. In a preferred embodiment, the lower confining layer is composed of an n-type $(Al_xGa_{1-x})_yIn_{1-y}P$ material, where $x \geq 0.6$ and $y=0.5\pm0.1$, while the upper confining layer is composed of a p-type $(Al_xGa_{1-x})_yIn_{1-y}P$ material, where $x \geq 0.6$ and $y=0.5\pm0.1$. The optional upper set-back layer is formed of an undoped $(Al_xGa_{1-x})_yIn_{1-y}P$ material, where $x \geq 0.6$ and $y=0.5\pm0.1$. The optional upper set-back layer may be used to help control the diffusion of p-type dopants from the upper confining layer into the active region during high temperature processing steps. The optional lower set-back layer may also be formed of an undoped or n-type $(Al_xGa_{1-x})_yIn_{1-y}P$ material, where $x \geq 0.6$ and $y=0.5\pm0.1$. The optional upper and lower set-back layers also generally have an aluminum composition, x, which is less than or equal to the aluminum composition of the upper and lower confining layers, although this is not necessarily the case. In the preferred embodiment discussed above, the first conductivity type is n-type and the second conductivity type is p-type. Since this is the most common LED configuration, we use this configuration as an example throughout this disclosure. It is also possible, however, to form the LED where the first conductivity type is p-type and the second conductivity type is n-type. The invention disclosed herein will work in either configuration.

The chirped multi-well active region of the LED includes N light emitting active layers and N–1 barrier layers, where N is an integer greater than one. In this embodiment, the light emitting active layers and the barrier layers are made of $(Al_xGa_{1-x})_yIn_{1-y}P$, where $0 \leq x \leq 1$ and $y=0.5\pm0.1$. The term "chirp" refers to non-uniform configuring or asymmetric configuring of similar layers with respect to their thickness and/or composition.

The chirped multi-well active region LED thus consists of a multi-well active region where the active layers and/or barrier layers are dissimilar in terms of their thickness and/or composition. Note that the differences in thickness and/or composition of the active layers and/or barrier layers are small enough that each active layer emits substantially the same color light, resulting in a highly monochromatic LED. In one embodiment of the chirped active region LED, the individual active layers within the active region are of non-equal thickness. In another embodiment of the chirped active region LED, the individual active layers are of equal thickness, but are of unequal composition. In yet another embodiment, the individual active layers are of unequal thickness and unequal composition. In yet another embodiment, the active layers are of equal thickness and equal composition, but the barrier layers between the active layers are of unequal composition, or unequal thickness, or of both unequal composition and unequal thickness. In yet another embodiment, a combination of non-equal thickness and/or composition of various barrier layers and/or active layers may be used within the active region.

The chirped multi-well active region design can be implemented in AlGaInP LEDs as described here, or in other III–V material LEDs, II–VI material LEDs, polymer or organic LEDs, and in other light generating devices, such as laser diodes and optical amplifiers, to improve the light output of that device.

DETAILED DESCRIPTION

Figure 2:
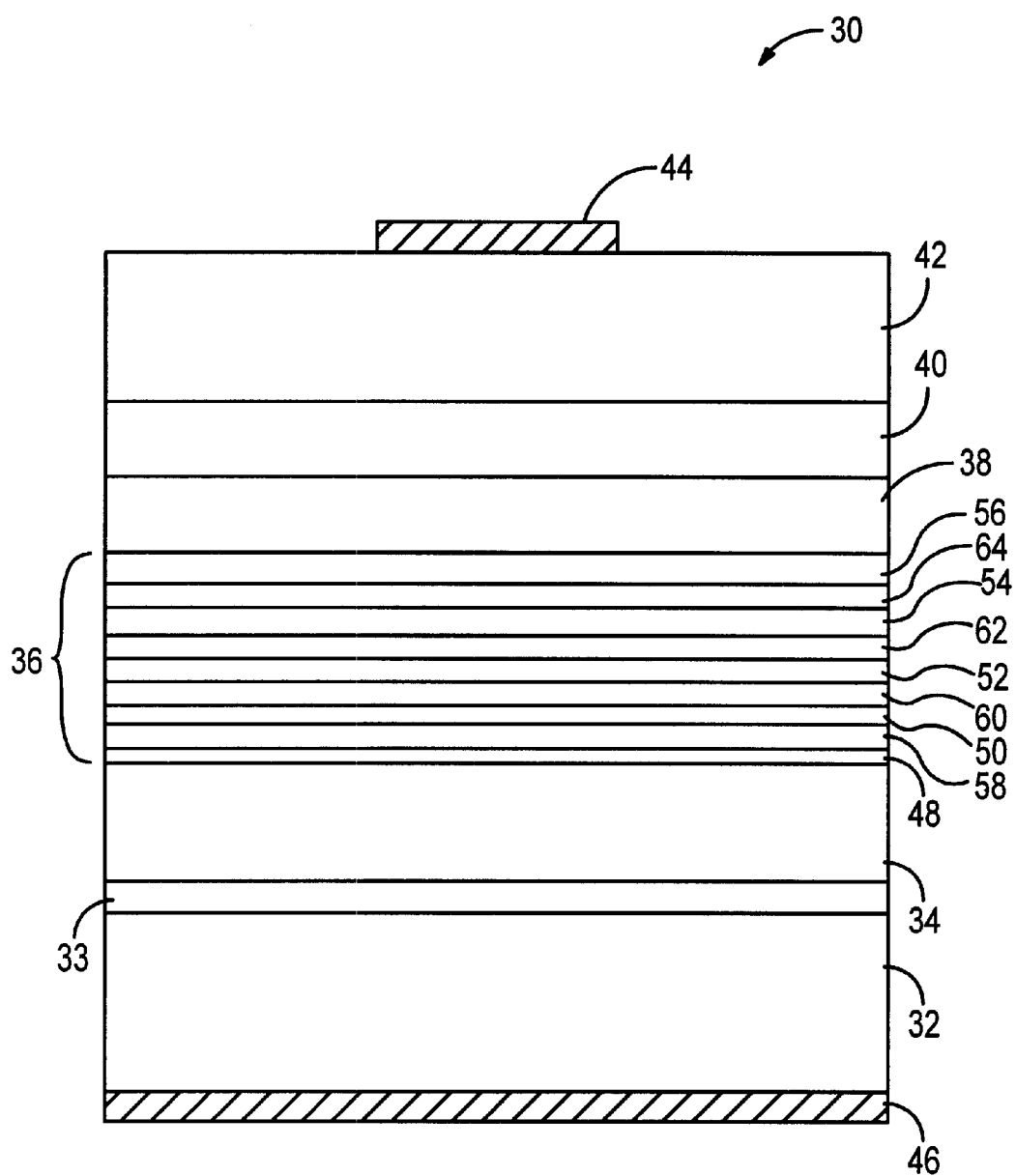
FIG. 2 is a schematic diagram of an LED with a chirped multi-well active region in accordance with an exemplary embodiment of the invention.

With reference to FIG. 2, an LED 30 with improved external quantum efficiency in accordance with an exemplary embodiment is shown. In this exemplary embodiment, the LED is an AlGaInP LED that includes a substrate 32 of first conductivity type, an optional distributed Bragg reflector layer 33 of first conductivity type, a lower confining layer 34 of first conductivity type, a chirped active region 36 which may be of first conductivity type, may be undoped, or may be of second conductivity type, an optional upper set-back layer 38 of second conductivity type, an upper confining layer 40 of second conductivity type and a window layer 42 of second conductivity type. The LED also includes two ohmic contacts 44 and 46 that couple the operating current to the device. The substrate is made of a semiconductor material, such as GaAs or GaP. In a preferred embodiment, the first conductivity type is n-type and the second conductivity type is p-type. In this preferred embodiment, the lower confining layer is composed of an n-type $(Al_xGa_{1-x})_yIn_{1-y}P$ material, where $x \geq 0.6$ and $y=0.5\pm0.1$, while the upper confining layer is composed of a p-type $(Al_xGa_{1-x})_yIn_{1-y}P$ material, where $x \geq 0.6$ and $y=0.5\pm0.1$. The optional upper set-back layer is formed of an undoped $(Al_xGa_{1-x})_yIn_{1-y}P$ material, where $x \geq 0.6$ and $y=0.5\pm0.1$. The optional upper set-back layer may be used to help control the diffusion of p-type dopants from the upper confining region into the upper set-back layer and the active region during high temperature processing steps. The upper set-back layer and active region may become p-type as a result of this diffusion process. The LED may include an optional lower set-back layer (not shown) between the lower confining layer and the active region. The optional lower set-back layer may be formed of an undoped or n-type (Al$_x$Ga$_{1-x}$)$_y$In$_{1-y}$P material, where x≧0.6 and y=0.5±0.1. The optional upper and lower set-back layers generally have an aluminum composition, x, which is less than or equal to the aluminum composition of the upper and lower confining layers, although this is not necessarily the case.

The chirped active region 36 of the LED 30 includes N light emitting active layers, or wells, that are individually separated by N−1 barrier layers, where N is an integer greater than one. Although the LED is shown in FIG. 2 as having only five active layers 48, 50, 52, 54 and 56 and four barrier layers 58, 60, 62 and 64, the number of active layers and barrier layers included in the active region may be significantly larger, or smaller. The chirped active region is structurally configured such that the light output of the LED is significantly improved. The term "chirp" refers to non-uniform configuring of similar layers with respect to their thickness and/or composition.

Light generation in an LED is described mathematically through the internal quantum efficiency, $\eta_{int}$, the radiative recombination rate, R, and the non-radiative recombination rate, $R_n$, where $$\eta_{int}=R/(R+R_n) \quad (1)$$

and $$R=Bnp \quad (2)$$

where B is a material dependent parameter known as the radiative recombination coefficient or radiative constant, and n and p are the electron and hole concentrations, respectively (i.e., the number of electrons per unit volume and the number of holes per unit volume, respectively). The electron and hole concentrations, n and p, may be further expressed in terms of the number of electrons, N, and the number of holes, P, and the volume, V, of the region of interest, where n=N/V, and p=P/V. From Eqs. 1 and 2, increasing the brightness or light output of the LED thus equates to increasing the radiative recombination rate, $$R=Bnp=B(N/V)(P/V)=BNP/V^2 \quad (3)$$

In the prior art, one method of increasing the brightness of LEDs has been to decrease the volume, V, of the active region. This method of increasing LED brightness is effective as long as the volume squared, $V^2$, decreases faster than the product, NP.

As discussed earlier, the active region of an LED may include a single light emitting active layer, or it may include multiple light emitting active layers. For an LED with multiple light emitting active layers, the total active layer thickness, D, is defined as being the sum of the thicknesses of each of the individual active layers. As an example, an LED with N light emitting active layers, each layer being of equal thickness, t, the total active layer thickness would be given by:

$$D=Nt \quad (4)$$

Assuming a fixed cross sectional area, A, the total active layer volume, V, is of course then given by:

$$V=DA \quad (5)$$

For an LED with fixed total cross sectional area, decreasing the total active layer volume, V, thus equates to decreasing the total active layer thickness. As mentioned above, one prior method of increasing LED brightness has been to decrease the total active layer volume. Alternative methods of increasing the LED light output include maintaining a fixed total active layer thickness, D, while simultaneously increasing the number of active layers, N, and decreasing the thickness, t, of each active layer.

In the present invention, the individual layer thicknesses or compositions, or both thicknesses and composition are engineered in such a way as to increase the radiative recombination rate, R, within the active layers of the LED.

Figure 1:
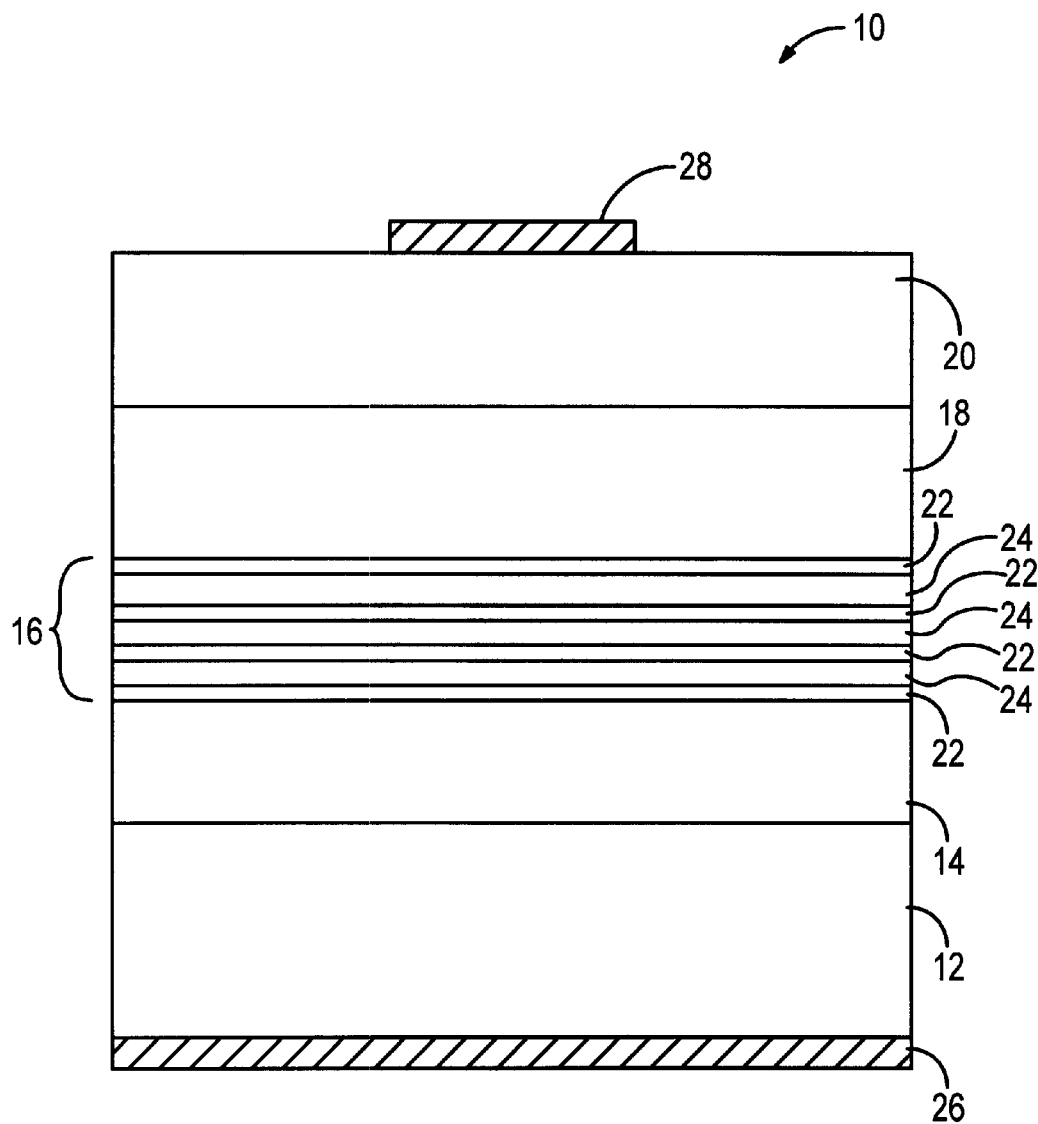
FIG. 1 is a schematic diagram of a prior art LED.
Figure 3A:
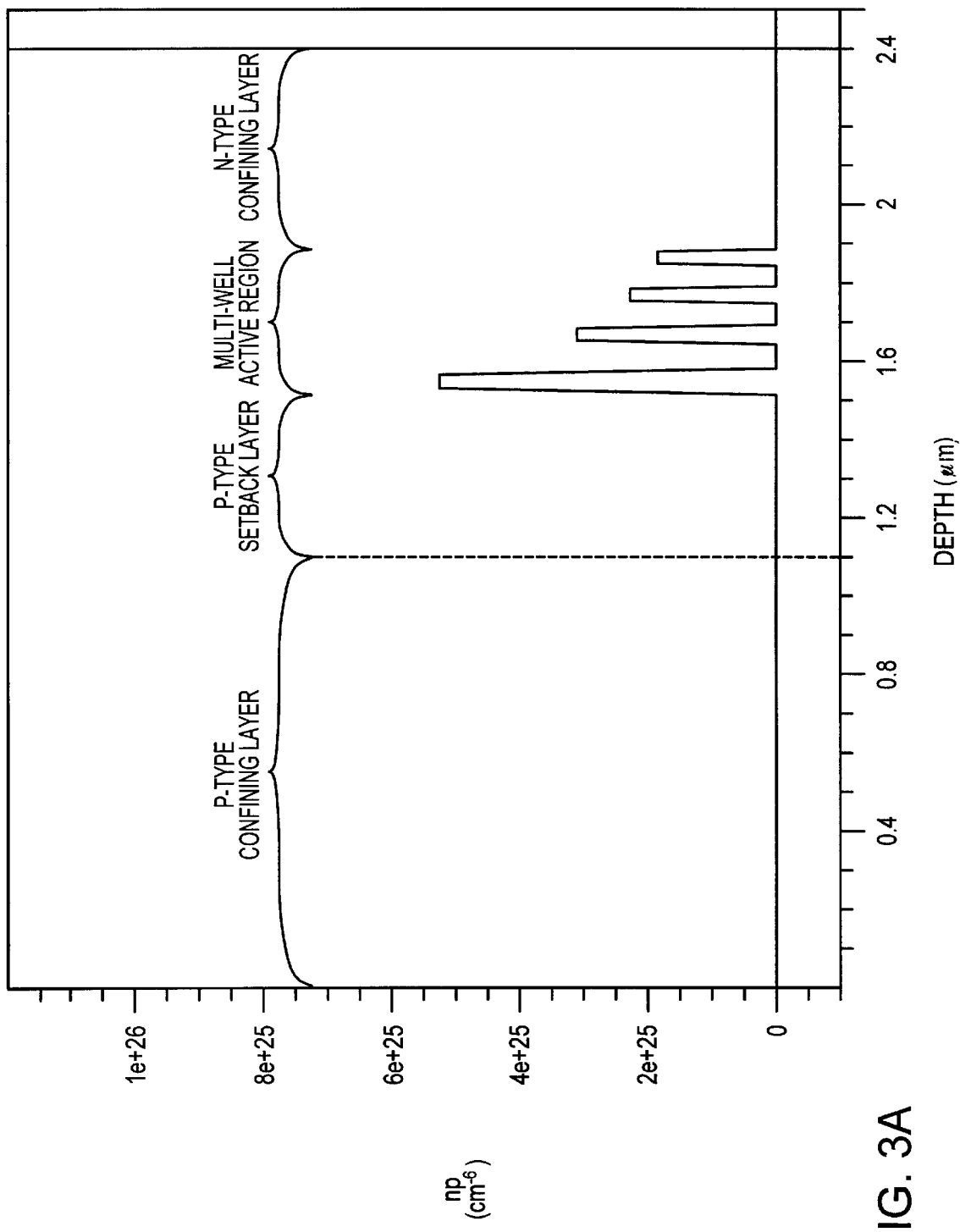
FIG. 3A is a graph showing the calculated np product of an LED with uniform-thickness light emitting active layers (uniform LED).

It is well known in semiconductor physics that the electron mobility is typically as much as 5 to 10 times or more higher than the hole mobility. (See, for example, B. G. Streetman, *Solid State Electronic Devices*, 3$^{rd}$ Ed., Prentice-Hall, 1990, page 439.) As a result, electrons that are injected from an n-type set-back layer or n-type confining layer into the active region will more easily diffuse through the active region than holes which are injected from the p-type set-back layer or p-type confining layer. Under steady state operating conditions, space-charge neutrality requires that the excess carrier populations are equal. Thus, the electrons and holes tend to accumulate near the interface between the active region and the p-type set-back or p-type confining layer. In other words, the np product is skewed to have its maximum value at or near the interface between the active region and the p-type set-back or p-type confining layer. This skewing of the np product results in inefficient light generation in the active layers near the n-type confining layer or the n-type set-back layer, and excessive electron leakage current into the p-type confining layer or the p-type set-back layer. (This effect is illustrated in FIG. 3A for a conventional LED such as that shown in FIG. 1. The data shown in FIG. 3A corresponds to a multi-well LED with four active layers, each active layer being 500 Angstroms thick as previously described by Gardner et al. (Appl. Phys. Lett., 74, 2230, 1999). Note that the np product in FIG. 3A is strongly skewed toward the p-type set-back or p-type confining layer.) Therefore, what is needed is a method of engineering the device structure such that the np product is more uniform across the active region.

Since the active layers nearest the interface between the active region and the n-type set-back or n-type confining layer tend to have the lowest np product, these active layers tend to be least effective at generating light. One method of increasing the light generation efficiency of these active layers is to decrease their volume (i.e., their thickness), thereby increasing the np product within these layers. Thus, in one embodiment, the individual active layers within the active region are constructed such as to be of unequal thickness, where the thicknesses of the various active layers are systematically chosen to provide a more uniform and higher np product throughout the active region. In a conventional LED, the np product in the active layers nearest the n-type confining layer or n-type set-back layer is less than the np product in the active layers nearest the p-type confining layer or p-type setback layer. Since the radiative recombination rate, R, is proportional to the np product, the radiative recombination rate and hence the LED brightness will be increased by increasing the np product in the active layers while simultaneously decreasing the np product in those layers that do not emit light, such as the p-type confining layer, the p-type set-back layer, the n-type confining layer, the n-type set-back layer, and the barrier layers within the active region. By decreasing the volume (thickness) of the active layers nearest the n-type confining layer or n-type set-back layer and simultaneously increasing the thickness of the active layers nearest the p-type confining layer or p-type set-back layer, the np product within each of these active layers is increased as shown through computer simulations in FIG. 3B. Note in FIG. 3A that the np product in the conventional LED ranges from approximately $5.25 \times 10^{25}$ cm$^{-6}$ in the active layer nearest the p-type set-back layer to approximately $2 \times 10^{25}$ cm$^{-6}$ in the active layer nearest the n-type confining layer. Alternatively, in FIG. 3B, for approximately the same operating current, the np product in the thickness chirped active region LED ranges from approximately $1.05 \times 10^{26}$ cm$^{-6}$ in the active layer nearest the p-type set-back layer to approximately $8.75 \times 10^{25}$ cm$^{-6}$ in the active layer nearest the n-type confining layer. A comparison of FIG. 3A and FIG. 3B thus indicates that the np product of the thickness chirped LED is not only higher in the active layer nearest to the n-type confining layer, but it is in fact higher in each of the active layers compared to the conventional uniform thickness LED. (Note that the increase in layer thickness for active layers nearest the p-type confining layer or p-type set-back layer is counter to prior teachings such as that of Huang et al. in U.S. Pat. No. 5,661,742, and of Sugawara et al., Jpn. J. Appl. Phys., 33, 5784, 1994, and Gardner et al., Appl. Phys. Lett., 74, 2230, 1999, which teach that thinner layers improve light output.)

Figure 4:
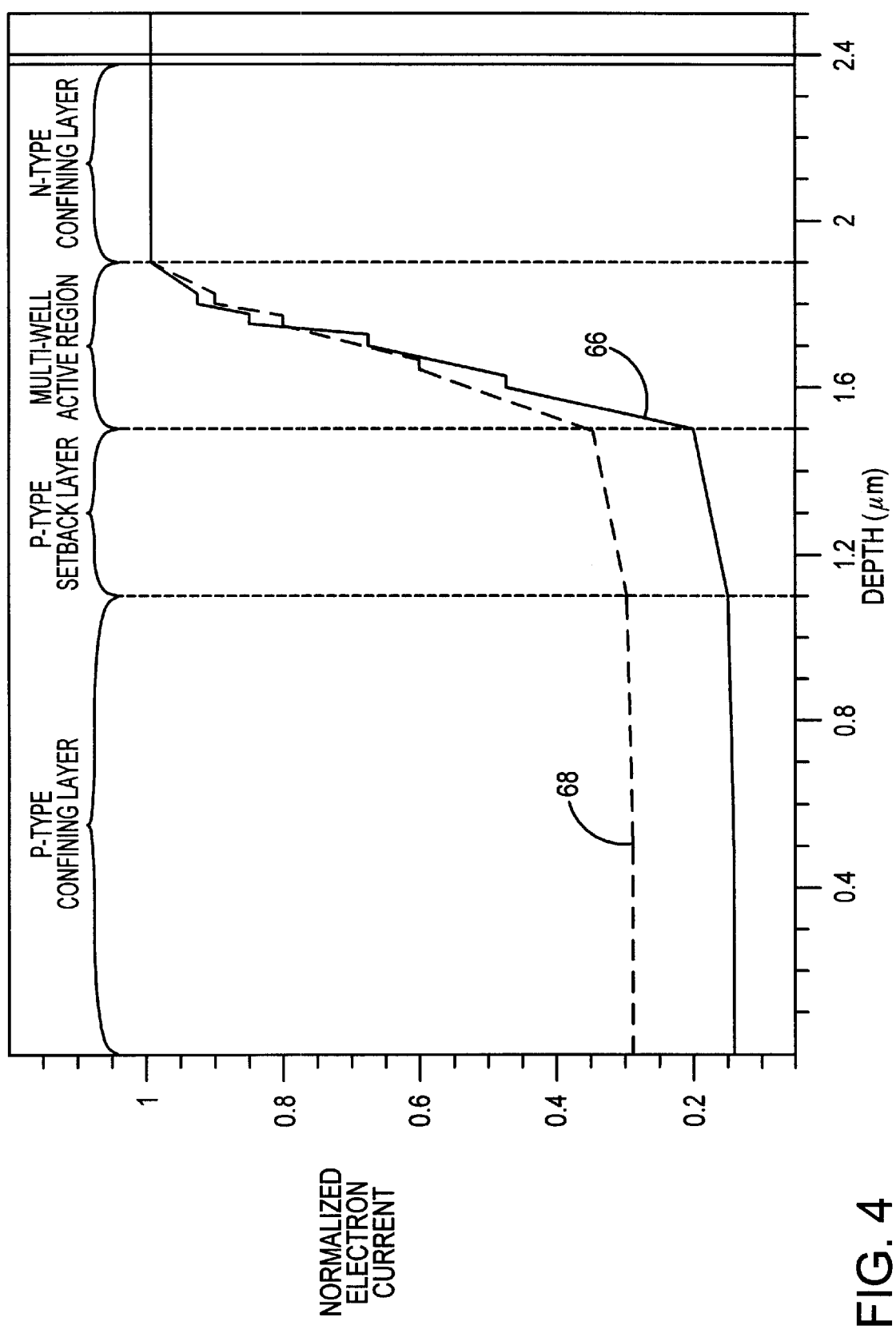
FIG. 4 is a graph showing the calculated electron current for the thickness-chirped LED and for the uniform LED.

Confirmation of this enhanced np product is shown in FIG. 4, where the electron current is illustrated within various layers of the conventional and thickness-chirped LED. Since the total current is composed of the electron current plus the hole current, it is optimal to have the total current equal to the majority carrier current outside of the active region. In other words, it is desirable to have all the electrons recombine with holes inside the active layers such that the electron current is equal to zero in the p-type confining layer and p-type set-back layer and to simultaneously have the hole current be equal to zero in the n-type set-back layer and n-type confining layer. We define the electron leakage current as being the electron current at the interface between the active region and the p-type layer nearest to the active region, i.e., the p-type set-back layer or p-type confining layer. Similarly, we define the hole leakage current as being the hole current at the interface between the active region and the n-type layer nearest to the active region, i.e., the n-type set-back layer or n-type confining layer. (Note that this hole leakage current is also sometimes referred to as the reverse injection current.) Since the electron and hole mobilities are typically not equal, the electron and hole leakage currents are typically not equal, and in fact, the high mobility carrier typically has a higher leakage current than the low mobility carrier. Since the electron is typically the high mobility carrier, engineering efforts toward increased LED light output typically focus on the more significant electron leakage current with the realization that a reduced electron leakage current will similarly tend to result in a reduced hole leakage current. As FIG. 4 illustrates for a conventional and thickness-chirped LED, the electron current is not zero in the p-type set-back or p-type confining layers. Increases in LED light output can be achieved by decreasing the electron leakage current, and as FIG. 4 shows, the electron leakage current is lower in the chirped active region LED (line 66) than in the conventional uniform multi-well LED (line 68). (This means that more electrons and holes recombine within the active region, and by inference, the hole leakage current should also be reduced.)

Figure 3B:
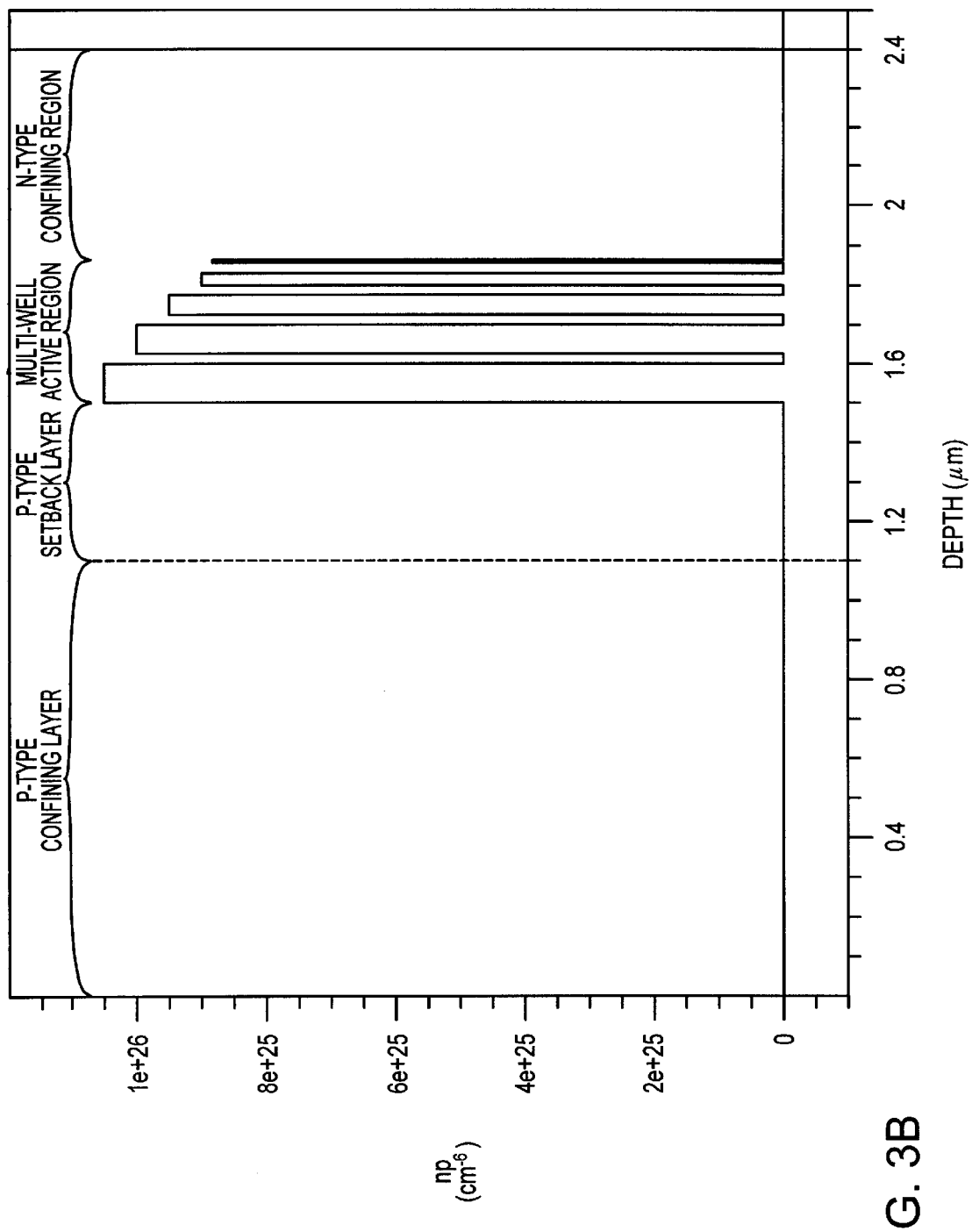
FIG. 3B is a graph showing the calculated np product of an LED with thickness-chirped light emitting active layers (thickness-chirped active region LED).
Figure 5:
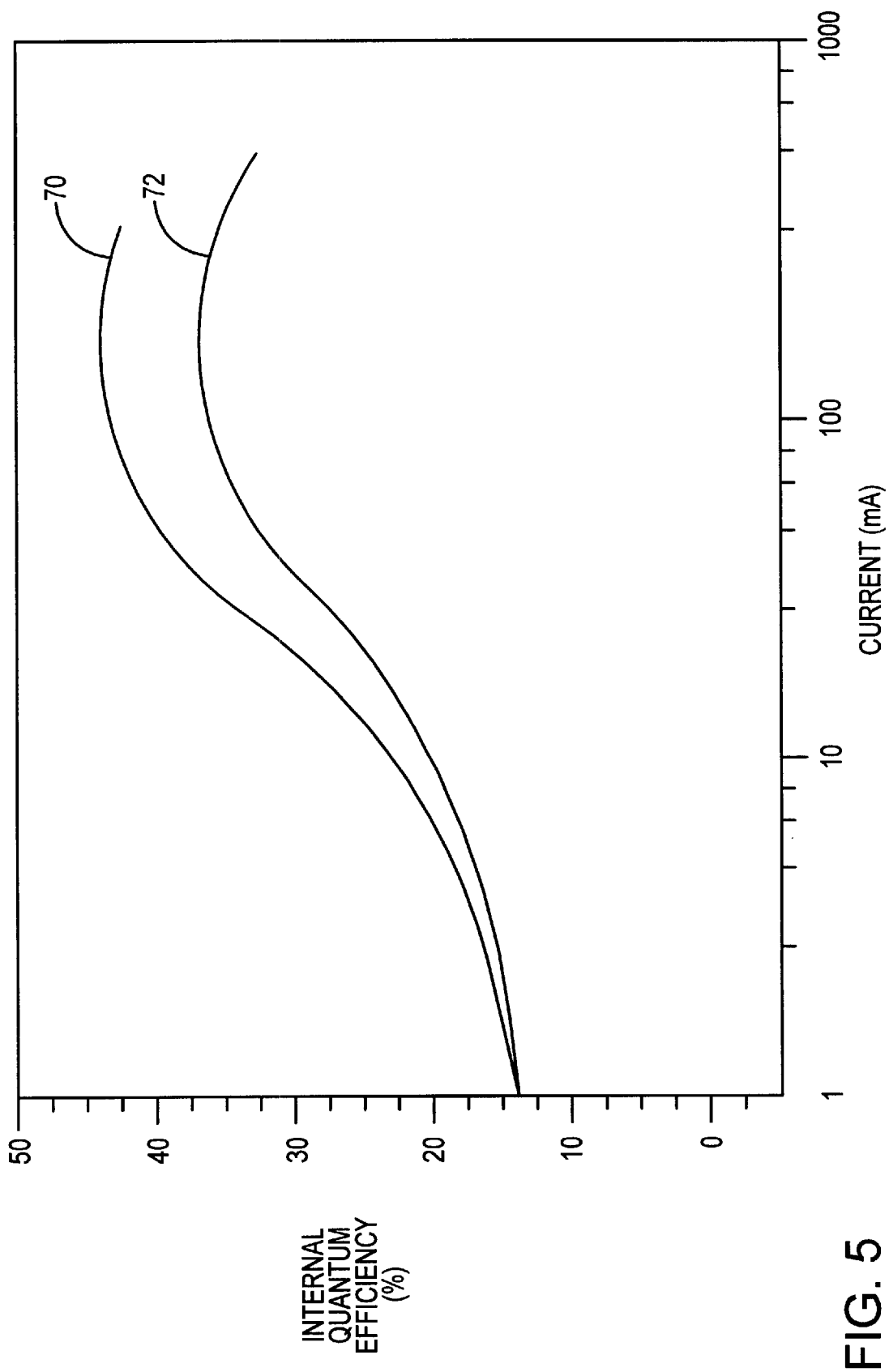
FIG. 5 is a graph showing the internal quantum efficiency for the thickness-chirped LED and the uniform LED.

Note that the electron leakage current in FIG. 4 is related to the integral of the np product in FIG. 3A and FIG. 3B. The lower electron leakage current for the chirped active region LED in FIG. 4 (line 66) relative to that of the conventional LED (line 68) thus indicates that more electrons recombine with holes in the active layers and the LED is thus brighter. FIG. 5 further substantiates this increased LED brightness through a computer simulated comparison of the internal quantum efficiency of the chirped active region LED (line 70) and the conventional LED (line 72). Note that the computer simulations in FIG. 5 predict that the chirped active region LED is brighter than the conventional LED.

Figure 6:
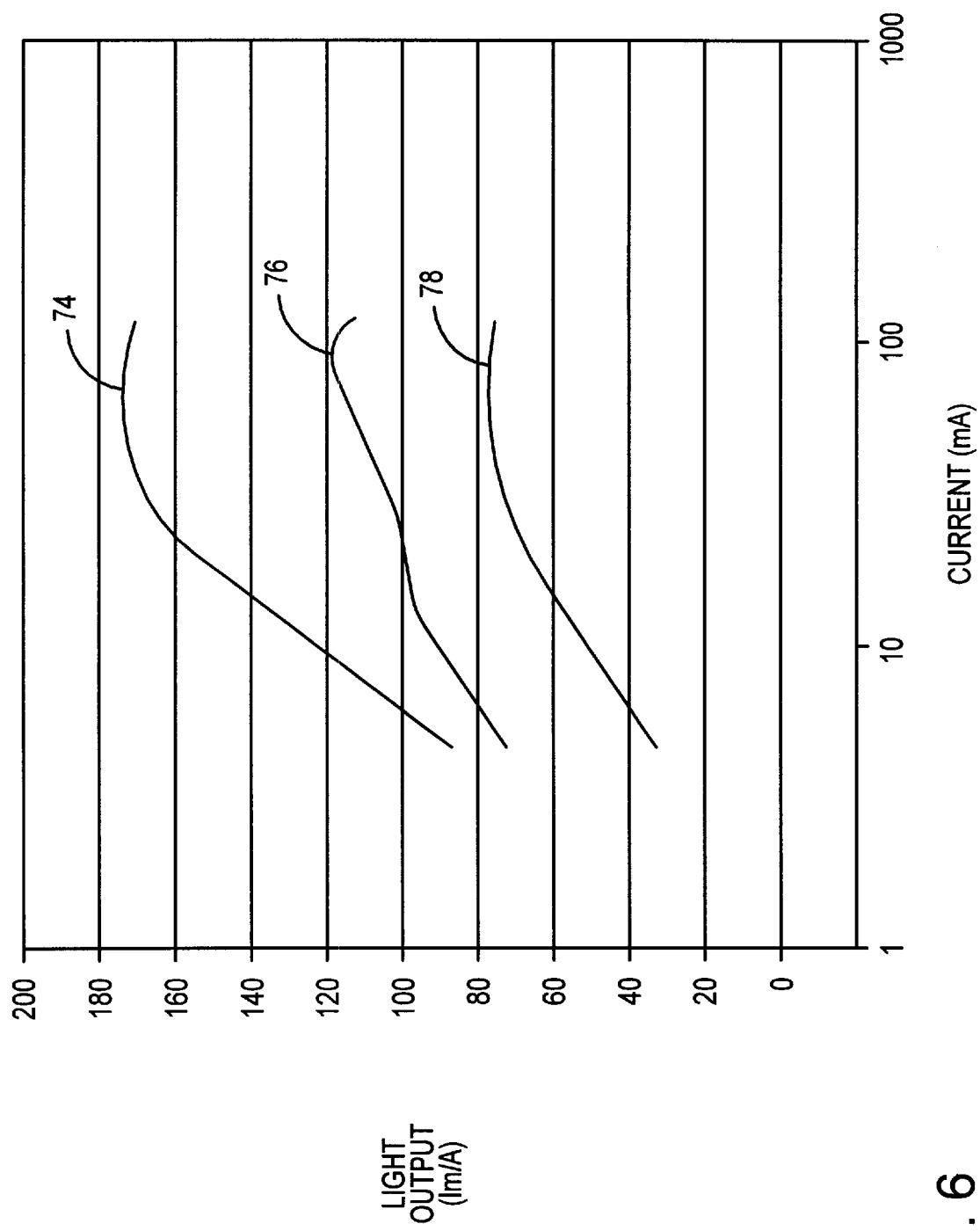
FIG. 6 is a graph showing the experimentally measured light output for the thickness-chirped LED, the uniform LED, and a DH LED.

Experimental verification of the data in FIG. 5 is given in FIG. 6, where the light output of a DH LED, a conventional multi-well LED, and a thickness-chirped active region LED is shown. Again, note that the thickness-chirped active region LED (line 74) is brighter than the uniform thickness, conventional multi-well LED (line 76) or the DH LED (line 78).

The above description of the chirped active region LED introduced the concept of systematically varying the active layer thickness to alter the electron and hole distribution within the active region of the LED. The first method discussed above thus increases the radiative recombination rate in the LED by selectively altering the volume of the individual active layers to increase the radiative recombination rate, R, by increasing n and/or p within the individual active layers. Alternative methods of altering the electron and/or hole distributions within the LED could also be applied to increase the LED brightness. For example, an alternative embodiment of the present invention is one where the thickness of each of the active layers within the active region is equal, but the composition of the active layers and/or barrier layers is different. In this method, the individual active layer volumes are all equal, but the energy bandgap difference between the wells and barriers is engineered in such a way as to increase N and/or P within the various active layers. This method of compositional chirping may be particularly beneficial to AlGaInN devices since active. layer thickness chirping has implications on piezoelectric effects in AlGaInN devices.

For an AlGaInP device in which the high mobility carriers are electrons, this compositional chirping method would involve varying the conduction band (and valence band) energies of the light emitting active layers by, for example, changing the Al content of the active layer. Thus, instead of making the active layers that are closer to the n-type confining layer thinner, the aluminum content in the active layers can be decreased, which lowers the conduction band energies in these layers to improve the electron confinement in the active layers nearest the n-type confining layer or n-type set-back layer. (Note that for an AlGaInN/GaN device, this compositional active layer chirping could be accomplished by increasing the indium content of the light emitting active layers nearest the n-type confining layer.)

The LED 30 of FIG. 2 takes advantage of the above findings to improve the light output of the device. In one arrangement, the active layers 48–56 of the active region 36 are chirped to achieve a more favorable electron and hole distribution within the active region. These more favorable carrier distributions within the active region can be achieved by changing the thickness of at least one light emitting active layer in the active region and/or by changing the composition of at least one active layer in the active region, e.g. the aluminum, gallium, or indium content. In another arrangement, the barrier layers 58–64 of the active region are chirped to achieve more favorable carrier distributions within the active region. In an alternative arrangement, both the active layers and the barrier layers may be chirped to provide the more favorable carrier distributions within the active region. Although the combinations of thicknesses and compositions for the active layers and the barrier layers are almost limitless, several fundamental examples are presented below to illustrate various possible configurations of the active layers and barrier layers of the chirped active region LED.

The first example is where only the thickness of the active layers 48–56 of the LED 30 are chirped. In this first example, the active layers 48, 50, 52, 54 and 56 of the active region 36 are configured to have thicknesses of 200, 300, 400, 500 and 600 Angstroms, respectively, as illustrated in FIG. 2. Thus, the active layer or layers that are closer to the n-type confining layer 34, where the high mobility carriers (electrons in this case) are injected into the active region, are thinner than the active layer or layers that are farther from the n-type confining layer. In a second example, only the compositions of the active layers are chirped. In this second example, the active layers 48, 50, 52, 54 and 56 of the active region may be configured to have Al contents of 0.25, 0.26, 0.27, 0.28, and 0.29, respectively. In effect, the conduction and/or valence band energy levels of the active layers are intentionally reduced near the n-type confining or n-type set-back layer to improve the carrier confinement in the active layers nearest to the n-type confining layer or n-type set-back layer. (Note that these small changes in composition would give only minor changes in color.) Alternative variations to these examples include cases where two or more active layers of the active region are identical with respect to thickness and/or composition. Thus, it is possible for the LED 30 to be configured such that only one of the active layers in the active region is different with respect to thickness and/or composition from the rest of the active layers in the chirped active region. Note that the above values of thickness, composition and number of active layers (N=5) are intended to serve as examples only, and are not intended to imply that the active region design is limited to include or contain these specific values of thickness, composition, or active layer number. In fact, significant light output gains have been observed or predicted with various thickness or compositional combinations, as will be shown in Table 1.

The third example is where only the thicknesses of the barrier layers 58–64 are chirped. In this example, the barrier layers may have thicknesses that vary from roughly 10 Angstroms to roughly 500 Angstroms or more. Similar to the thickness configuration of the active layers 48–56, the barrier layers can be arranged so that the barrier layers that are closer to the n-type lower confining layer 34 are thicker than the barrier layers that are further away from the n-type lower confining layer, where the thicker barrier layer or layers increase the carrier confinement when compared to the thinner barrier layer or layers.

Figure 7:
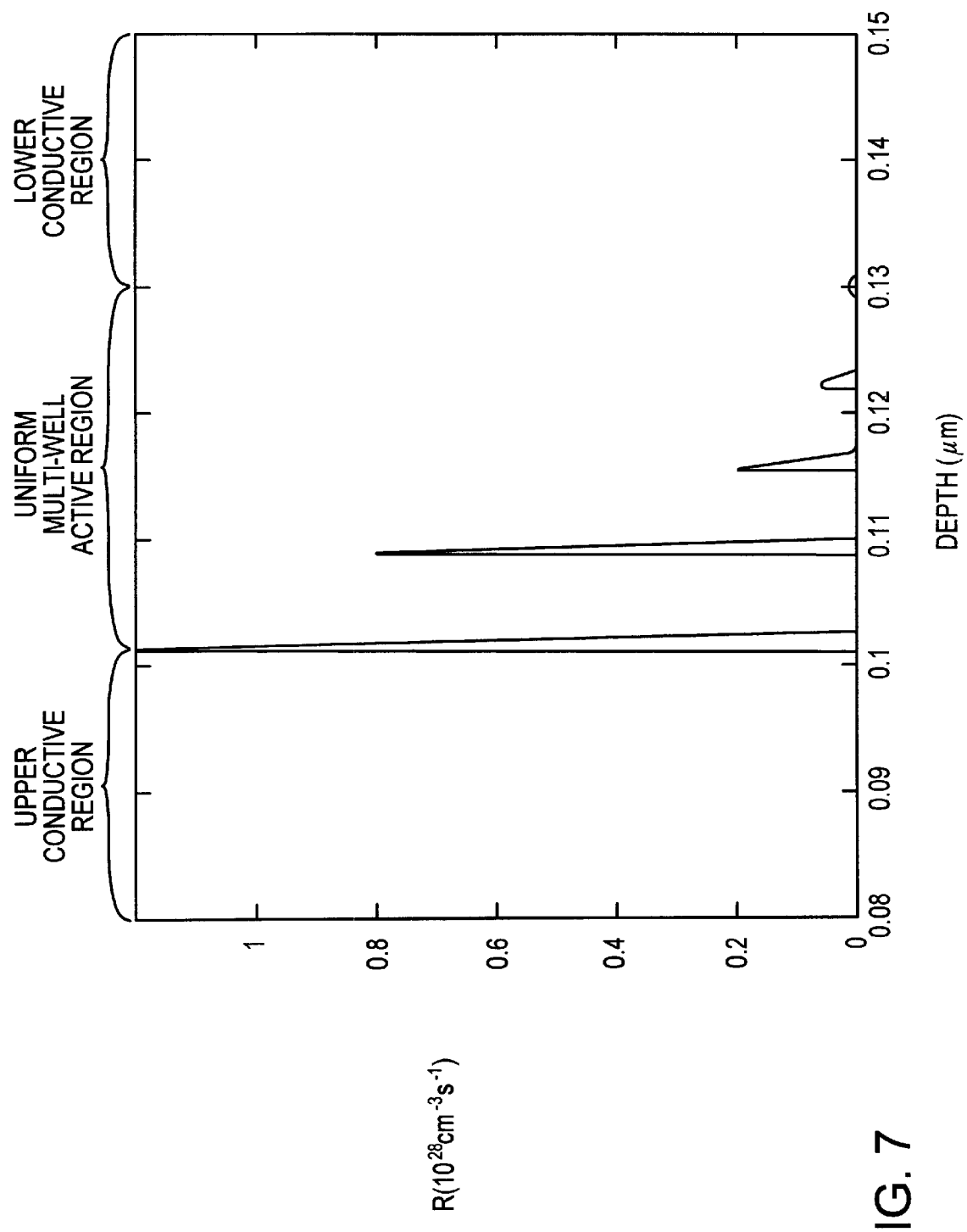
FIG. 7 is a graph showing the calculated radiative recombination rate (proportional to np) for a conventional AlGaInN/GaN LED with five uniform wells and four uniform barriers.
Figure 8:
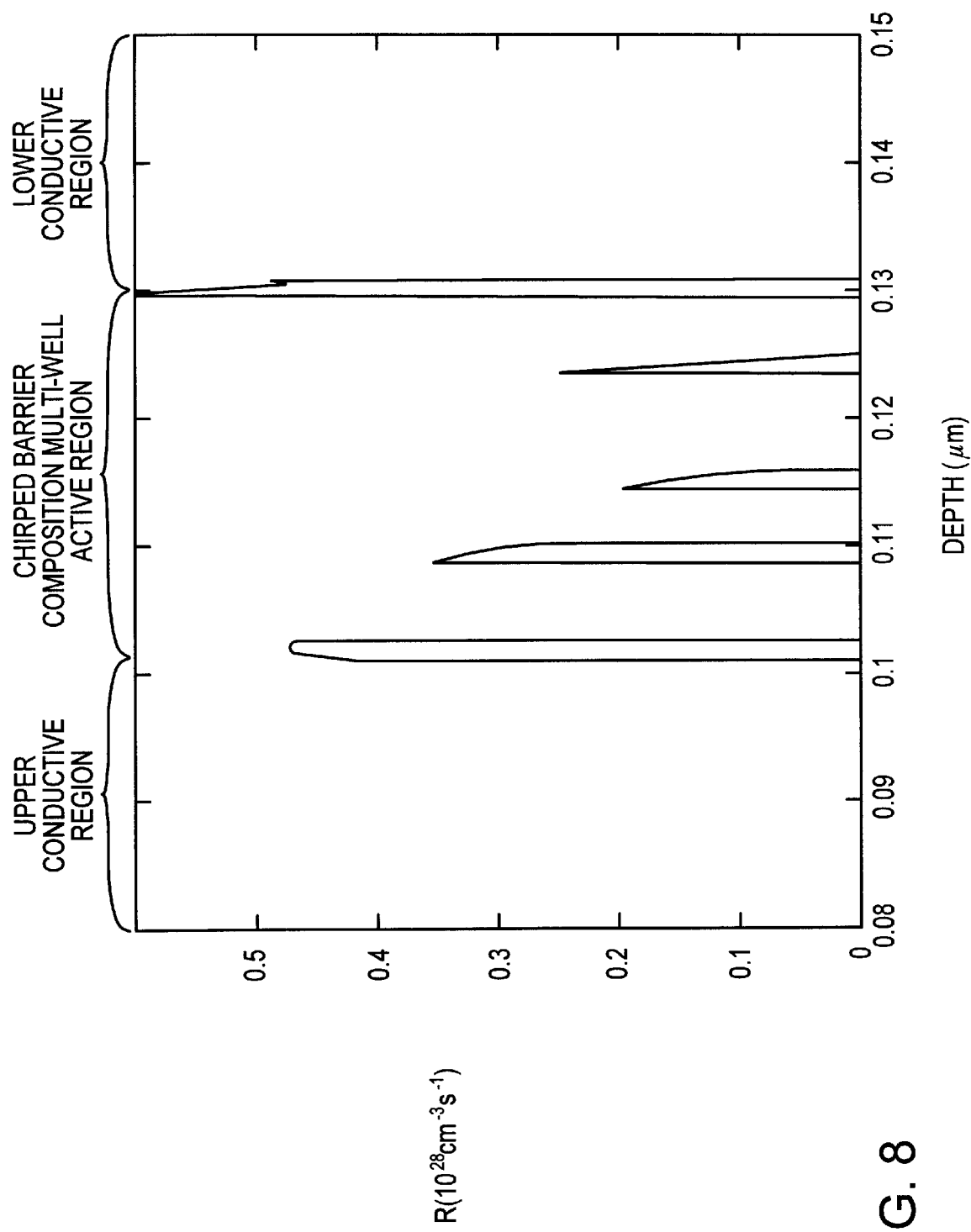
FIG. 8 is a graph showing the calculated radiative recombination rate (proportional to np) for an AlGaInN/GaN LED with five uniform wells and four compositionally chirped barriers.

Simulations and experiments show that the consequences of the unequal electron and hole mobilities are even more significant in AlGaInN/GaN LEDs than in AlGaInP LEDs, so AlGaInN/GaN LEDs are also expected to benefit from the invention disclosed herein. In addition to the AlGaInP LED simulations shown in FIGS. 3 through 5, simulations of AlGaInN/GaN LEDs are also used to illustrate these benefits for AlGaInN/GaN LEDs in FIGS. 7 and 8. Thus, FIG. 7 illustrates a simulation of the radiative recombination rate, R, (proportional to the np product, as previously described in Eq. 2) for an AlGaInN/GaN LED with five uniform wells and four uniform barriers. Note that most of the radiative recombination and hence light emission in this device occurs in the first few wells of the active region, i.e., the light emitting active layers closest to the p-type confining layer. Since AlGaInN/GaN LEDs are typically grown on transparent substrates such as sapphire or SiC, this effect is particularly detrimental to the light output of AlGaInN/GaN LEDs. Therefore, AlGaInN/GaN LED structures will also benefit from the described techniques to make the np product more uniform within the active region. In fact, FIG. 8 shows the radiative recombination rate for an AlGaInN/GaN device with five uniform light emitting active layers and four compositionally chirped barrier layers. In this particular example, the compositions of the barrier layers 58–64 are x=0.02, 0.04, 0.06, and 0.08, respectively, where x denotes the indium composition in the $In_xGa_{1-x}N$ alloy. Again, variations to these arrangements with respect to the barrier layers are possible to achieve a more favorable np product within the chirped active region. A more favorable np product refers to a higher and more uniform np product within the active region, as illustrated in FIG. 3B, relative to that of a conventional LED, such as that of FIG. 3A. This increased total np product within the active region results in increased radiative recombination within the active region (as previously described in Eq. 2), which equates to increased LED brightness. Although the number of combinations of active layer and/or barrier layer thickness and/or composition are practically unlimited, we summarize several characteristic examples of structures that have been simulated or fabricated in Table 1. (Refer to FIG. 2 for an illustration of the active layers 48–56 and the barrier layers 58–64.)

TABLE 1

Effect of Various Chirping Designs on Light Output

| Chirping method | Detailed design | Approximate measured or predicted light output gain |
|---|---|---|
| Thickness of AlGaInP active layers 48, 50, 52, 54 and 56 | 200, 300, 400, 500, 600 A | 15 to 30% |
| Thickness of AlGaInP active layers 48, 50, 52, 54 and 56 | 200, 200, 400, 400, 800 A | 10 to 20% |
| Thickness of AlGaInP active layers 48, 50, 52 and 54 | 200, 200, 700, 900 A (This device had only 4 active layers.) | 10 to 20% |
| Composition of AlGaInP active layers 48, 50, 52, 54 and 56 | 0.25, 0.26, 0.27, 0.28, 0.29 | 0 to 5% |
| Composition of AlGaInP active layers 48, 50, 52, 54 and 56 | 0.26, 0.26, 0.27, 0.27, 0.28 | 10 to 20% |
| Composition of AlGaInN barrier layers 58, 60, 62 and 64 | 0.02, 0.04, 0.06, 0.08 | 15 to 30% |

Although the chirped active region LED may consist of various designs, such as non-equal active layer thickness, non-equal active layer composition, non-equal barrier layer thickness, non-equal barrier layer composition, or some combination of the above, all of these designs have a common attribute as illustrated by the conduction band diagrams in FIGS. 9A, 9B, 9C and 9D. For a conventional, uniform LED, such as the prior art in FIG. 1, there exists a plane through which the active region can be bisected into two equal and identical halves. For a conventional, uniform LED with an even number of light emitting active layers, this bisecting plane will be located in the center of a barrier layer, as illustrated by the boldface line 80 in FIG. 9A. Conversely, for a conventional, uniform LED with an odd number of light emitting active layers, this bisecting plane will be located in the center of an active layer.

Figure 9B:
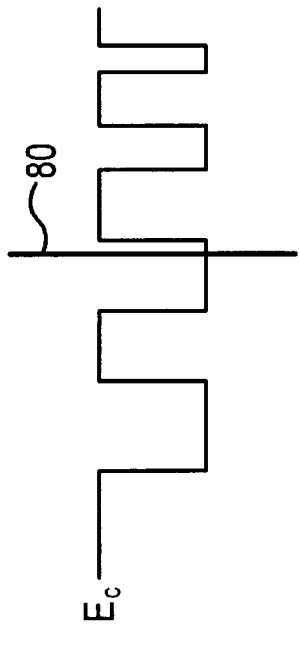
FIGS. 9B, 9C and 9D illustrate the asymmetric nature of the active region for three exemplary embodiments of the present invention, including chirped active layer thickness, chirped active layer composition, and chirped barrier composition, respectively.
Figure 9D:
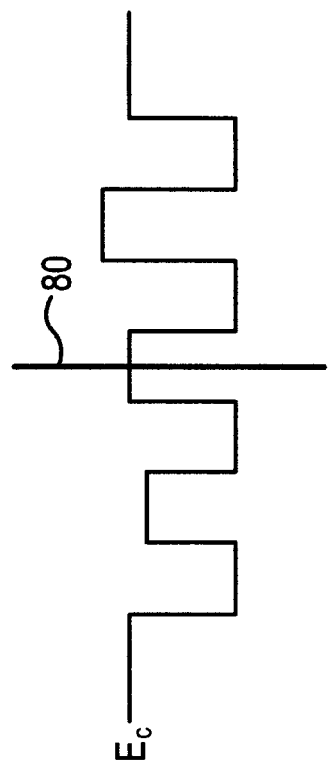
Figure 9A:
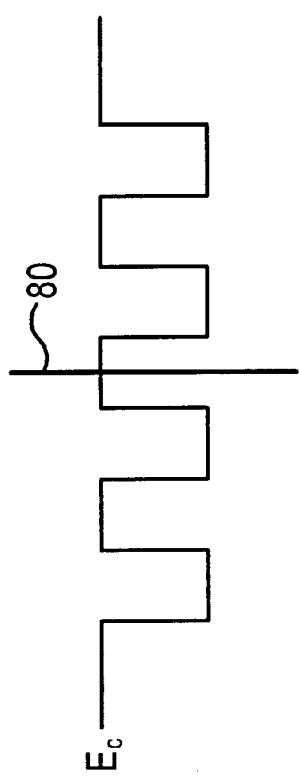
FIG. 9A is an illustration of the conduction band edge of a conventional symmetric active region LED consisting of four wells and three barriers.
Figure 9C:
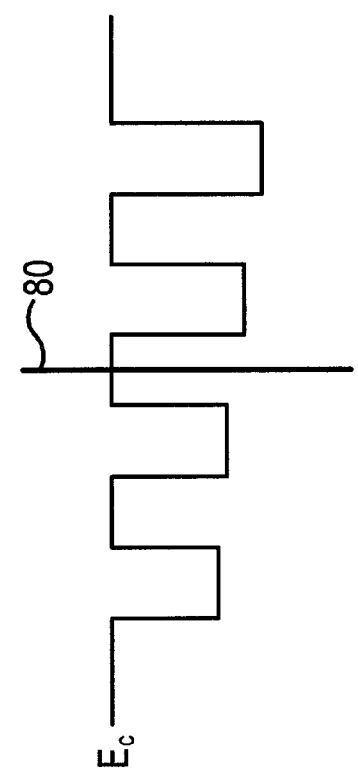

Alternatively, for the chirped active region LED, the light emitting active layers and/or barrier layers are asymmetric with respect to structure (i.e., thickness and/or composition) such that the active region cannot be bisected into two equal and indistinguishable halves. This concept is illustrated in FIGS. 9B, 9C and 9D with respect to thickness chirped active layers, compositionally chirped active layers, and compositionally chirped barrier layers. Although the active region can of course be bisected into two halves of equal thickness as shown by line 80, the bisecting plane does not divide the active region into two identical halves. Also, the same attribute of course holds true for thickness chirped barriers, as well as the various possible combinations of active layers and/or barrier layers which are chirped with respect to thickness and/or composition. We therefore refer to the chirped active region LED as consisting of asymmetric layers or as having an asymmetric structure within the active region, and this asymmetric structure is a distinguishing factor with respect to the prior art.

It is known that the dominant wavelength of light emitted from an active layer can be tuned by changing the composition of the active layer. Furthermore, the thickness of an active layer can also be varied to tune the dominant wavelength of the emitted light, if the thickness of the active layer is less than the quantum thickness. This method of tuning the dominant wavelength of the emitted light has been utilized to fabricate LEDs that produce white light. The method involves selectively tuning the dominant wavelength of the light emitted from each active layer to blend the light emitted from various active layers to produce visible white light or broadband visible or infrared radiation. Examples of these methods are described in U.S. Pat. No. 5,138,624 to Hong et al., U.S. Pat. No. 5,684,309 to McIntosh et al., U.S. Pat. No. 5,126,803 to Hager et al., and U.S. Pat. No. 5,563,900 to Ackley et al. Although these prior inventions apply non-uniform layer thickness or composition to the active region of an LED, these techniques are all designed to produce broadband emission sources such as white light or multi-color light sources, i.e., each active layer within the active region is designed to produce a different color or wavelength of light.

Several factors distinguish the present invention from this prior art. First, to produce white light, it is necessary to combine at least two colors of light (red light with a dominant wavelength ~600 nm or more, and blue-green light with a dominant wavelength ~510 nm or less) and preferably three colors of light (red, green and blue). Since very few materials are capable of producing this wide range of colors that are required to produce white light, the method of McIntosh et al. will only work for a very limited set of materials, such as AlGaInN. Second, the "quality" or "whiteness" of any light source is described by a parameter known as color purity, where an ideal white light source has a color purity of zero and a monochromatic light source has a color purity of 1. (Typical AlGaInP and AlGaInN LEDs have a color purity of greater than 0.9.) The methods described in U.S. Pat. No. 5,138,624 and U.S. Pat. No. 5,684,309 are intended to produce LEDs with white light where the color purity is close to zero. The method described herein is alternatively designed to produce a highly saturated light source (i.e., nearly monochromatic), where the color purity is 0.5 or greater, and preferably 0.9 or greater. The concept of color purity is described in the book *Semiconductors and Semimetals*, Vol. 48, (Academic Press, 1997), page 250. Third, the broadband emission sources described in the prior art have a broad, relatively flat emission spectrum with a full width at half maximum (FWHM) of ~50 nm or more. In contrast, the chirped active region LEDs disclosed herein have a narrow, well defined emission spectra with a FWHM ~45 nm or less, and preferably 30 nm or less.

Figure 10:
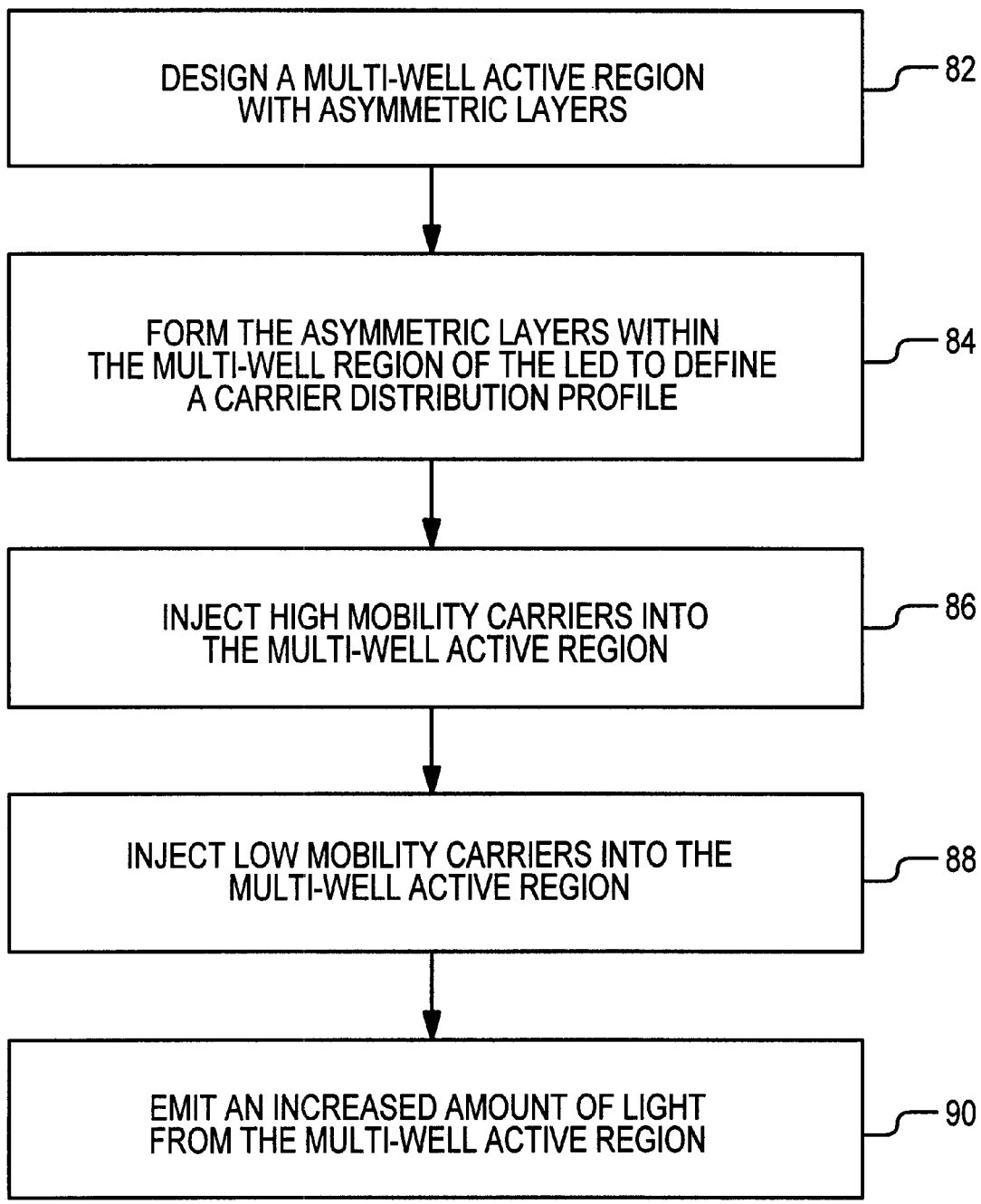
FIG. 10 is a flow diagram of a method for increasing the light output of a light emitting device in accordance with the invention.

A method of improving the light output of an LED, such as the LED 30 of FIG. 2, will be described with reference to FIG. 10. During step 82, a multi-well active region is designed such that the active region includes asymmetric layers. In a preferred embodiment, the active region is configured to emit light having a non-white spectral distribution with a FWHM of less than 45 nm, and a peak wavelength greater than 10 nm and less than 100 $\mu$m. The asymmetric layers may be light emitting active layers within the multi-well active region. Alternatively, the asymmetric layers may be barrier layers within the multi-well active region. In yet another configuration, the asymmetric layers may be a nearly unlimited combination of barrier layers and light emitting active layers. Next, during step 84, the asymmetric layers within the multi-well active region of the LED are formed to define a carrier distribution profile. The carrier distribution profile within the multi-well active region can be defined by controlling the thicknesses and/or the compositions of the asymmetric layers. During step 86, high mobility carriers are injected into the multi-well active region. During step 88, low mobility carriers are injected into the multi-well active region. Due to the carrier distribution profile defined by the asymmetric layers within said multi-well active region, the total radiative recombination rate within the multi-well active region is increased relative to that of a conventional light emitting device. During step 90, an increased amount of light is emitted from the multi-well active region. This increase in light output is attributable to the increased total radiative recombination rate within the multi-well active region. Note that, once the LED is optimized, step 82 need not be repeated each time steps 84 through 90 are performed.

Although the chirped active region design was described with reference to AlGaInP and AlGaInN LEDs, the chirped active region design can be implemented in other III–V material LEDs, II–VI material LEDs, polymer or organic LEDs, and in other light generating devices, such as laser diodes and optical amplifiers. In fact, any optoelectronic or electronic device which depends on the recombination of electrons and holes to generate visible, infrared, ultraviolet, or other electromagnetic radiation could benefit from the chirped active region design described herein. In devices where the high mobility carriers are holes, the sequence of layer thickness and/or composition would be reversed from the above examples relative to the n-type and p-type setback or confining layers. Although the invention disclosed herein was partially described in terms of minimizing the electron leakage current, the problem could also be approached from the viewpoint of minimizing the hole leakage current, and similar conclusions would apply.

The essential concept behind the chirped active region LED relates to the fact that the carrier distribution across the active region of a conventional LED is non-optimal due to the fact that the electron and hole mobilities are typically not equal. The purpose of the chirped active region LED is to use asymmetries in active region design, i.e., layer thickness, layer composition or both layer thickness and layer composition within the active region to substantially compensate for differences in the electron and hole mobility, resulting in a higher and more uniform np product throughout the active region, ultimately giving a brighter LED or other light emitting source. Asymmetries in either the light emitting active layers or barrier layers or both may be used to realize this improved carrier distribution or np product. Note that nearly all electronic and optoelectronic materials have non-equal electron and hole mobilities, so the chirped active region or asymmetric structural design disclosed herein could be applied to nearly all electronic and optoelectronic materials and devices composed of these materials, and these devices would benefit from the invention disclosed herein. For example, electronic devices are typically composed of materials such as Si, GaAs or InP. The electron mobilities of these materials are ~1350 cm$^2$/V–s, ~8500 cm$^2$/V–s and ~4000 cm$^2$/V–s, respectively, while the hole mobilities of these materials are ~480 cm$^2$/V–s, ~400 cm$^2$/V–s and ~100 cm$^2$/V–s, respectively. Similarly for optoelectronic devices, the electron mobilities of materials such as GaP and CdTe are ~300 cm$^2$/V–s and ~1050 cm$^2$/V–s, respectively, while the hole mobilities are ~150 cm$^2$/V–s and 100 cm$^2$/V–s, respectively. Alternatively, the electron mobility of AlSb is ~200 cm$^2$/V–s, while the home mobility of AlSb is ~300 cm$^2$/V–s (i.e., the hole mobility is greater than the electron mobility). The mobilities of these and other materials can be found in books such as B. G. Streetman, *Solid State Electronic Devices*, 3$^{rd}$ Ed., Prentice-Hall, 1990, page 439. In addition to these unequal mobilities in semiconductor materials, polymer and organic LED materials are also known to have unequal electron and hole mobilities as described in the literature. For example, Bozano et al., Appl. Phys. Lett., 74, 1132, 1999, indicate a case where the zero field hole mobility in a polymer LED is ~1×10$^{-7}$ cm$^2$/V–s, while the electron mobility is roughly a factor of ten lower than the hole mobility. Additional discussions of the unequal electron and hole mobilities in polymer and organic LEDs are given by Scott et al., Appl. Phys. Left., 74, 1510, 1999, and in the book *Semiconductors and Semimetals*, Vol. 64, Academic Press, 2000, page 262.

It should be noted that the preferred method of fabricating the structures described here is by metalorganic chemical vapor deposition (MOCVD), however different fabrication methods, such as molecular beam epitaxy (MBE) or vapor phase epitaxy (VPE) could also be used. The invention could be realized in $(Al_xGa_{1-x})_yIn_{1-y}P$ LEDs or $(Al_xGa_{1-x})_yIn_{1-y}N$ LEDs, where $0 \leq x \leq 1$ and $0 \leq y \leq 1$. Also, in addition to the GaAs or GaP substrate described here, the present invention could also be grown on or otherwise mechanically attached to other substrate materials such as sapphire, SiC, InGaP, Si, Ge, GeSi, metals, glass, or other materials. The conductivity type of the various layers could also be modified such that the device is grown on, bonded to, or otherwise attached to a p-type substrate, with p-type lower confining layer, optional p-type lower set-back layer, active region, optional n-type upper set-back layer, n-type upper confining layer, and n-type window layer. The device described here has been described with an optional window layer which could be composed of materials such as $(Al_xGa_{1-x})_yIn_{1-y}P$ or $(Al_xGa_{1-x})_yIn_{1-y}N$, where $0 \leq x \leq 1$ and $0 \leq y \leq 1$, or it could be composed of AlGaAs, or other materials. In addition to the p-type active region described here, the device could also be fabricated with an undoped active region or an n-type active region, or the p-n junction could be located within the active region. The device could also be grown with lattice mismatched layers in the active layers, the active region barriers, set-back layers or confining layers. The device could also include a region of graded composition with one or more layers, such as the optional upper set-back layer, the optional lower set-back layer, the barrier layers within the active region, or other layers within the device being composed of compositions of $(Al_xGa_{1-x})_yIn_{1-y}P$ or $(Al_xGa_{1-x})_yIn_{1-y}N$, where x and/or y are changed within a given layer. The device could also be grown or otherwise manufactured with a current blocking layer underneath the p-type or n-type ohmic contact.

It is also important to note that the invention disclosed here will work whether all of the layers within the active region (light emitting active layers and barrier layers) are thicker than the quantum thickness, or all of the layers in the active region are thinner than the quantum thickness, or some of the layers within the active region are thicker than the quantum thickness while other layers in the active region are thinner than the quantum thickness. It is important to note that the optimal device design will depend on material properties such as the compositional dependence of the conduction band and valence band offsets, which are different for different materials. This fact is particularly important for compositional chirping methods. The most appropriate chirped active region design may therefore be different for different materials. Also, current density plays an important role in LED efficiency and the optimal LED design may depend on the intended operating current density.

It is important to note that the changes in composition and/or thickness in this invention are not random, but are systematic, with any changes in the thickness and/or composition within any portion of the active region being monotonic across said portion of the active region as indicated by a representative set of examples in Table 1 and FIG. 9.

What is claimed is:

1. A device for emitting electromagnetic radiation comprising:
    a substrate;
    a lower region of a first conductivity type positioned over said substrate;
    a multi-well active region positioned over said lower region, said multi-well active region including a plurality of layers, said plurality of layers including at least two light emitting active layers and at least one barrier layer, said plurality of layers being asymmetric, said light emitting active layers being configured such that light generated in said active region has a peak wavelength greater than 10 nm and less than 100 um, said light further having a non-white spectral distribution, said light further having a color purity of at least 0.5 and a spectral distribution with a full width at half maximum of less than 45 nm; and
    an upper region of second conductivity type positioned over said active region.

2. The device of claim 1 wherein at least one of said light emitting active layers within said active region is configured to be thinner than a second light emitting active layer within said active region.

3. The device of claim 2 wherein at least one of said light emitting active layers is thicker than a threshold thickness, said threshold thickness being defined as the upper thickness limit for said light emitting active layers to operate in the quantum regime.

4. The device of claim 2 wherein at least one of said light emitting active layers is thinner than a threshold thickness, said threshold thickness being defined as the upper thickness limit for said light emitting active layers to operate in the quantum regime.

5. The device of claim 2 wherein one of said lower and upper regions is a p-type region, and wherein said second light emitting active layer is positioned between said p-type region and said thinner light emitting active layer.

6. The device of claim 1 wherein at least one of said light emitting active layers within said active region is configured to have a lower bandgap energy than a second light emitting active layer within said active region.

7. The device of claim 6 wherein at least one of said light emitting active layers within said active region contains less aluminum than said second light emitting active layer.

8. The device of claim 6 wherein at least one of said light emitting active layers within said active region contains more indium than said second light emitting active layer.

9. The device of claim 6 wherein one of said lower and upper regions is a p-type region, and wherein said second light emitting active layer is positioned between said p-type region and said lower bandgap light emitting active layer.

10. The device of claim 1 wherein said active region includes a plurality of barrier layers, each of said barrier layers being positioned between two adjacent light emitting active layers, said barrier layers being asymmetric structures.

11. The device of claim 10 wherein at least one of said barrier layers is configured to be thinner than a second barrier layer within said active region.

12. The device of claim 11 wherein one of said lower and upper regions includes an n-type confining layer, and wherein said second barrier layer is positioned between said n-type confining layer and said thinner barrier layer.

13. The device of claim 10 wherein at least one of said barrier layers within said active region is configured to have a lower bandgap energy than a second barrier layer within said active region.

14. The device of claim 13 wherein one of said lower and upper regions includes an n-type confining layer, and wherein said second barrier layer is positioned between said n-type confining layer and said lower bandgap barrier layer.

15. The device of claim 1 wherein at least one of said light emitting active layers within said active region is configured to be thinner, and to have a lower bandgap energy than a second light emitting active layer within said active region.

16. The device of claim 1 wherein said active region includes a plurality of barrier layers, each of said barrier layers being positioned between two adjacent light emitting active layers, said barrier layers and said active layers being asymmetric.

17. The device of claim 1 wherein at least one of the active layers is thinner than another active layer, and at least one of the active layers has a lower bandgap than another of the active layers.

18. A device for emitting electromagnetic radiation comprising:
a substrate;
a lower region of a first conductivity type positioned over said substrate;
a multi-well active region positioned over said lower region, said multi-well active region including a plurality of light emitting active layers and a plurality of barrier layers, said plurality of barrier layers being asymmetric;
said multi-well region being structurally configured such that light generated from said multi-well active region has a color purity of at least 0.5 and a spectral distribution with a full width at half maximum of less than 45 nm; and
an upper region of a second conductivity type positioned over said active region.

19. The device of claim 18 wherein a first barrier layer has a lower bandgap energy than a second barrier layer.

20. The device of claim 19 wherein one of said lower and upper regions includes an n-type confining layer, and wherein said second barrier layer is positioned between said n-type confining layer and said first barrier layer.

21. The device of claim 18 wherein at least one of said barrier layers within said active region contains less aluminum than said second barrier layer.

22. The device of claim 18 wherein at least one of said barrier layers within said active region contains more indium than said second barrier layer.

23. The device of claim 18 wherein a first barrier layer is thinner than a second barrier layer.

24. The device of claim 18 wherein at least one of the barrier layers is thinner than another barrier layer, and at least one of the barrier layers has a lower bandgap than another of the barrier layers.

25. A device for emitting electromagnetic radiation comprising:
a substrate;
a lower conductive region of a first conductivity type positioned over said substrate;
a multi-well active region positioned over said lower conductive region, said multi-well active region including at least a first light emitting active layer of a first thickness and a second light emitting active layer of a second thickness, said multi-well region being structurally configured such that light generated from said multi-well active region has a color purity of at least 0.5 and a spectral distribution with a full width at half maximum of less than 45 nm; and
an upper conductive region of a second conductivity type positioned over said active region.

26. The device of claim 25 wherein said first and second light emitting active layers are configured such that at least one of said first and second light emitting active layers has a thickness greater than the material-dependent quantum thickness.

27. The device of claim 25 wherein said first and second light emitting active layers are configured such that at least one of said first and second light emitting active layers has a thickness less than the material-dependent quantum thickness.

28. The device of claim 25 wherein the electron mobility in a layer of said device is greater than the hole mobility in a layer of said device, wherein one of said lower and upper conductive regions includes a p-type confining layer, and wherein said first light emitting active layer is positioned between said p-type confining layer and said second light emitting active layer within said active region, said first thickness of said first light emitting active layer being greater than said second thickness of said second light emitting active layer.

29. The device of claim 25 wherein the hole mobility in a layer of said device is greater than the electron mobility in a layer of said device, wherein one of said lower and upper conductive regions includes an n-type confining layer, and wherein said first light emitting active layer is positioned between said n-type confining layer and said second light emitting active layer within said active region, said first thickness of said first light emitting active layer being greater than said second thickness of said second light emitting active layer.

30. The device of claim 25 wherein said multi-well active region includes a plurality of barrier layers, each of said barrier layers being positioned between two adjacent light emitting active layers, said barrier layers being asymmetric.

31. The device of claim 30 wherein at least one of said barrier layers is configured to be thinner than a second barrier layer within said active region.

32. The device of claim 31 wherein the electron mobility in a layer of said device is greater than the hole mobility in a layer of said device, wherein one of said lower and upper conductive regions includes an n-type confining layer, and wherein said second barrier layer is positioned between said n-type confining layer and said thinner barrier layer.

33. The device of claim 31 wherein the hole mobility in a layer of said device is greater than the electron mobility in a layer of said device, wherein one of said lower and upper conductive regions includes a p-type confining layer, and wherein said second barrier layer is positioned between said p-type confining layer and said thinner barrier layer.

34. The device of claim 30 wherein at least one of said barrier layers within said active region is configured to have a lower bandgap energy than a second barrier layer within said active region.

35. The device of claim 34 wherein at least one of said barrier layers within said active region is configured to have less aluminum than a second barrier layer within said active region.

36. The device of claim 34 wherein at least one of said barrier layers within said active region is configured to have more indium than a second barrier layer within said active region.

37. A device for emitting electromagnetic radiation comprising:

a substrate;

a lower conductive region of a first conductivity type positioned over said substrate;

a multi-well active region positioned over said lower conductive region, said multi-well active region including at least a first light emitting active layer of a first composition and a second light emitting active layer of a second composition, said multi-well active region being structurally configured such that light generated from said multi-well active region has a color purity of at least 0.5 and a spectral distribution with a full width at half maximum of less than 45 nm; and an upper conductive region of a second conductivity type positioned over said active region.

38. The device of claim 37 wherein the first light emitting active layer has a lower bandgap energy than the second light emitting active layer.

39. The device of claim 37 wherein the first light emitting active layer contains more indium than the second light emitting active layer.

40. The device of claim 37 wherein at least two of the light emitting active layers are of different thicknesses.

41. The device of claim 37 wherein said multi-well active region includes at least two barrier layers, said barrier layers being asymmetric.

42. The device of claim 41 wherein a first barrier layer has a lower bandgap than a second barrier layer.

43. The device of claim 41 wherein a first barrier layer is thinner than a second barrier layer.

* * * * *